(12) United States Patent
Su et al.

(10) Patent No.: US 8,201,068 B2
(45) Date of Patent: Jun. 12, 2012

(54) METHOD FOR GENERATING PARITY-CHECK MATRIX

(75) Inventors: York-Ted Su, Chia-Yi (TW); Shih-Yao Wang, Chiayi (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 829 days.

(21) Appl. No.: 12/349,493

(22) Filed: Jan. 6, 2009

(65) Prior Publication Data

US 2010/0174972 A1    Jul. 8, 2010

(51) Int. Cl.
    *G06F 11/00* (2006.01)
(52) U.S. Cl. .................................. 714/801; 714/752
(58) Field of Classification Search .................. None
    See application file for complete search history.

(56) References Cited

U.S. PATENT DOCUMENTS

| | | | | |
|---|---|---|---|---|
| 2005/0152408 A1* | 7/2005 | Jeong et al. | .................. | 370/529 |
| 2005/0229087 A1* | 10/2005 | Kim et al. | .................. | 714/800 |
| 2006/0206781 A1* | 9/2006 | Choi et al. | .................. | 714/758 |
| 2007/0136635 A1* | 6/2007 | Niu et al. | .................. | 714/752 |
| 2007/0162822 A1* | 7/2007 | Choi et al. | .................. | 714/758 |
| 2008/0288846 A1* | 11/2008 | Kyung et al. | .................. | 714/752 |

OTHER PUBLICATIONS

Bai et al., "Symmetric Distributed Source Coding Using LDPC Code", 2008, IEEE.*
Hu et al., "Regular and Irregular Progressive Edge-Growth Tanner Graphs", 2005, IEEE.*
Richter et al., "On a Construction Method of Irregular LDPC Codes without Small Stopping Sets", 2006, IEEE.*

* cited by examiner

*Primary Examiner* — Gabriel Chu
(74) *Attorney, Agent, or Firm* — Winston Hsu; Scott Margo

(57) ABSTRACT

A method for generating a parity check matrix to decode a plurality of underdetermined nodes, includes the steps of: determining a plurality of specific nodes according to a predetermined parity check matrix; determining a plurality of weightings corresponding to the plurality of specific nodes; and sorting the plurality of specific nodes according to the plurality of weightings to generate the parity check matrix to store in a storage device.

11 Claims, 5 Drawing Sheets

METHOD FOR GENERATING PARITY-CHECK MATRIX

BACKGROUND

The present invention relates to a method for generating a parity-check code, and more particularly, to a method for re-scheduling a low density parity-check code to generate a re-scheduled low density parity-check code.

In the field of decoding a digital data, a low density parity-check codes (LDPC codes) is utilized to correct the error bit(s) of the digital data after transmitted over a noisy transmission channel. Please refer to FIG. 1. FIG. 1 is a diagram illustrating a conventional multi-stage graph 10 for correcting a seven-bit inputting digital data, i.e., the bit nodes v1, v2, v3, v4, v5, v6, v7, according to a LDPC codes C, wherein the LDPC codes C is represented by the following matrix:

$$C = \begin{pmatrix} 1 & 1 & 0 & 0 & 1 & 0 & 0 \\ 0 & 1 & 0 & 0 & 1 & 0 & 1 \\ 0 & 0 & 1 & 0 & 0 & 1 & 1 \\ 1 & 0 & 0 & 1 & 1 & 1 & 1 \end{pmatrix}.$$

According to the multi-stage graph 10, the values of the bit nodes v1, v2, v3, v4, v5, v6, v7 are passed to four check nodes c1, c2, c3, c4 according to the paths between the bit nodes v1, v2, v3, v4, v5, v6, v7 and the check nodes c1, c2, c3, c4, in which the paths is generated in accordance with the LDPC codes C. Each check node performs a checking calculation upon the values of the bit nodes that directed to the respective check node. For example, the check node v1 checks the values of the bit nodes v1, v2, v5, and passes the results to the same bit nodes, i.e., v1, v2, v5. Therefore, a plurality of paths can be found from a bit node vi to a bit node vj on the conventional multi-stage graph 10.

Furthermore, since the parallel decoding of the LDPC codes C requires large memory and multiple processors, a parallel-serial manner can be utilized for decoding the bit nodes v1, v2, v3, v4, v5, v6, v7, in which the number of processors used in the parallel-serial manner is less than the parallel one. According to the parallel-serial manner, the check nodes c1, c2, c3, c4 of the multi-stage graph 10 are partitioned into a plurality of disjoint groups, i.e., two disjoint groups in this example, in which one group is comprised of the check nodes c1, c2, and the other group is comprised of the check nodes c3, c4. Then, a specific processors are assigned to compute the bit nodes, i.e., v1, v2, v5, v7, corresponding to the check nodes c1, c2 in a first cycle, and then the specific processors are assigned to compute the bit nodes, i.e., v1, v3, v4, v5, v6, v7, corresponding to the check nodes c3, c4 in a second cycle. In addition, depending on whether the partition is performed on the check nodes c1, c2, c3, c4 or the bit nodes v1, v2, v3, v4, v5, v6, v7, the multi-stage graph 10 is categorized into the vertical shuffled belief propagation (VSBP) and the horizontal shuffled belief propagation (HSBP). However, the conventional multi-stage graph 10, no matter the vertical shuffled belief propagation (VSBP) or the horizontal shuffled belief propagation (HSBP), does not consider the short cycle effect, in which the short cycle effect may affect the correctness of the results calculated by the check nodes c1, c2, c3, c4. Therefore, providing an accurate and efficient checking method for the digital data is a significant concern in the communication system.

SUMMARY OF THE INVENTION

One of the objectives of the present invention is to provide a method for re-scheduling a low density parity-check code to generate a re-scheduled low density parity-check code to solve the above-mentioned problem.

According to an embodiment of the present invention, a method for generating a parity check matrix to decode a plurality of underdetermined nodes is disclosed. The method comprises the step of: determining a plurality of specific nodes according to a predetermined parity check matrix; determining a plurality of weightings corresponding to the plurality of specific nodes; and sorting the plurality of specific nodes according to the plurality of weightings to generate the parity check matrix to store in a storage device.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
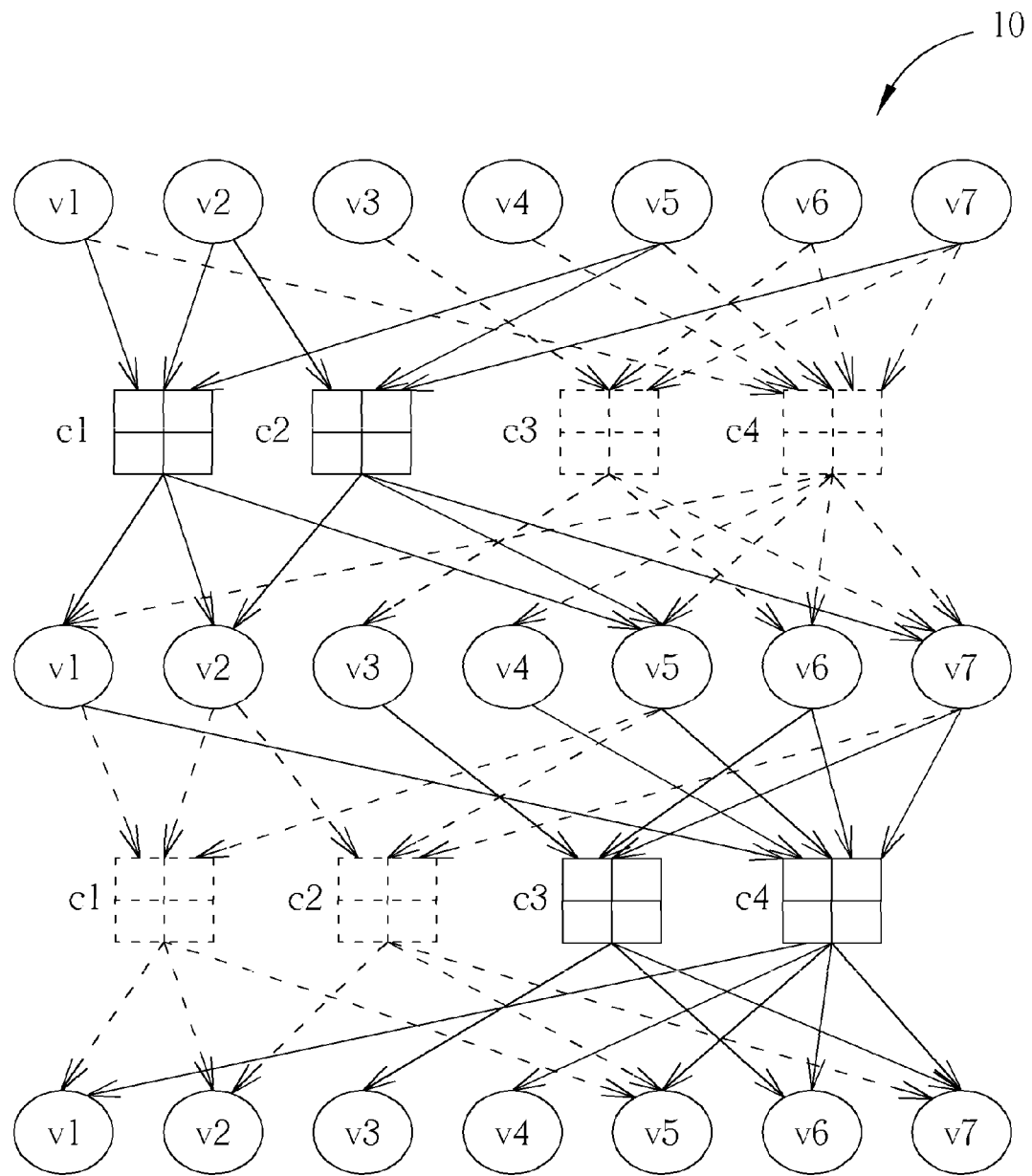
FIG. 1 is a diagram illustrating a conventional multi-stage graph for correcting a seven-bit inputting digital data.
Figure 2:
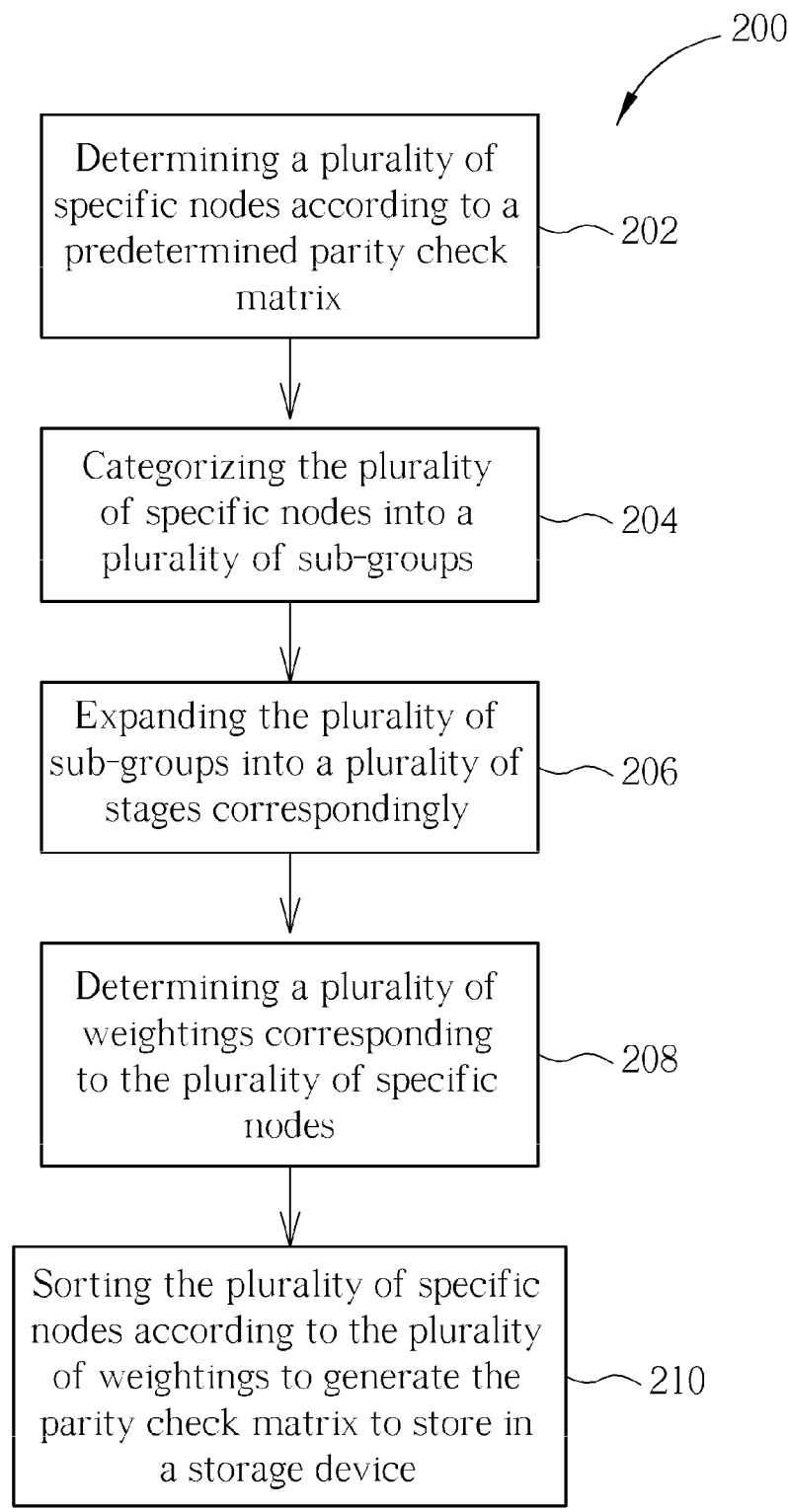
FIG. 2 is a flowchart illustrating a method for generating a parity check matrix to decode a plurality of underdetermined nodes according to an embodiment of the present invention.

Please refer to FIG. 2. FIG. 2 is a flowchart illustrating a method 200 for generating a parity check matrix H' to decode a plurality of underdetermined nodes V1, V2, V3, V4, V5, V6, V7 according to an embodiment of the present invention. Provided that substantially the same result is achieved, the steps of the flowchart shown in FIG. 2 need not be in the exact order shown and need not be contiguous, that is, other steps can be intermediate. The method 200 comprises the following steps:

step 202: determining a plurality of specific nodes C1, C2, C3, C4 according to a predetermined parity check matrix H;

step 204: categorizing the plurality of specific nodes C1, C2, C3, C4 into a plurality of sub-groups G1, G2, wherein each sub-group comprises at least one specific node, and each specific node has a plurality of paths connecting to a plurality of nodes of the plurality of underdetermined nodes V1, V2, V3, V4, V5, V6, V7;

step 206: expanding the plurality of sub-groups G1, G2 into a plurality of stages correspondingly;

step 208: determining a plurality of weightings δ1, δ2, δ3, δ4 corresponding to the plurality of specific nodes C1, C2, C3, C4;

step 210: sorting the plurality of specific nodes C1, C2, C3, C4 according to the plurality of weightings δ1, δ2, δ3, δ4 to generate the parity check matrix H' to store in a storage device.

Please note that, according to this embodiment, the plurality of specific nodes C1, C2, C3, C4 are check nodes and the plurality of underdetermined nodes V1, V2, V3, V4, V5, V6, V7 are bit nodes, but this is not meant to be a limitation of the present invention. In another embodiment of the present invention, the plurality of specific nodes C1, C2, C3, C4 are bit nodes and the plurality of underdetermined nodes V1, V2, V3, V4, V5, V6, V7 are check nodes. In addition, in order to describe the spirit of the present invention in more clearly, the predetermined parity check matrix H is set the same as the above-mentioned LDPC codes C, which is also represented by the following matrix:

$$H = \begin{pmatrix} 1 & 1 & 0 & 0 & 1 & 0 & 0 \\ 0 & 1 & 0 & 0 & 1 & 0 & 1 \\ 0 & 0 & 1 & 0 & 0 & 1 & 1 \\ 1 & 0 & 0 & 1 & 1 & 1 & 1 \end{pmatrix}.$$

Figure 3:
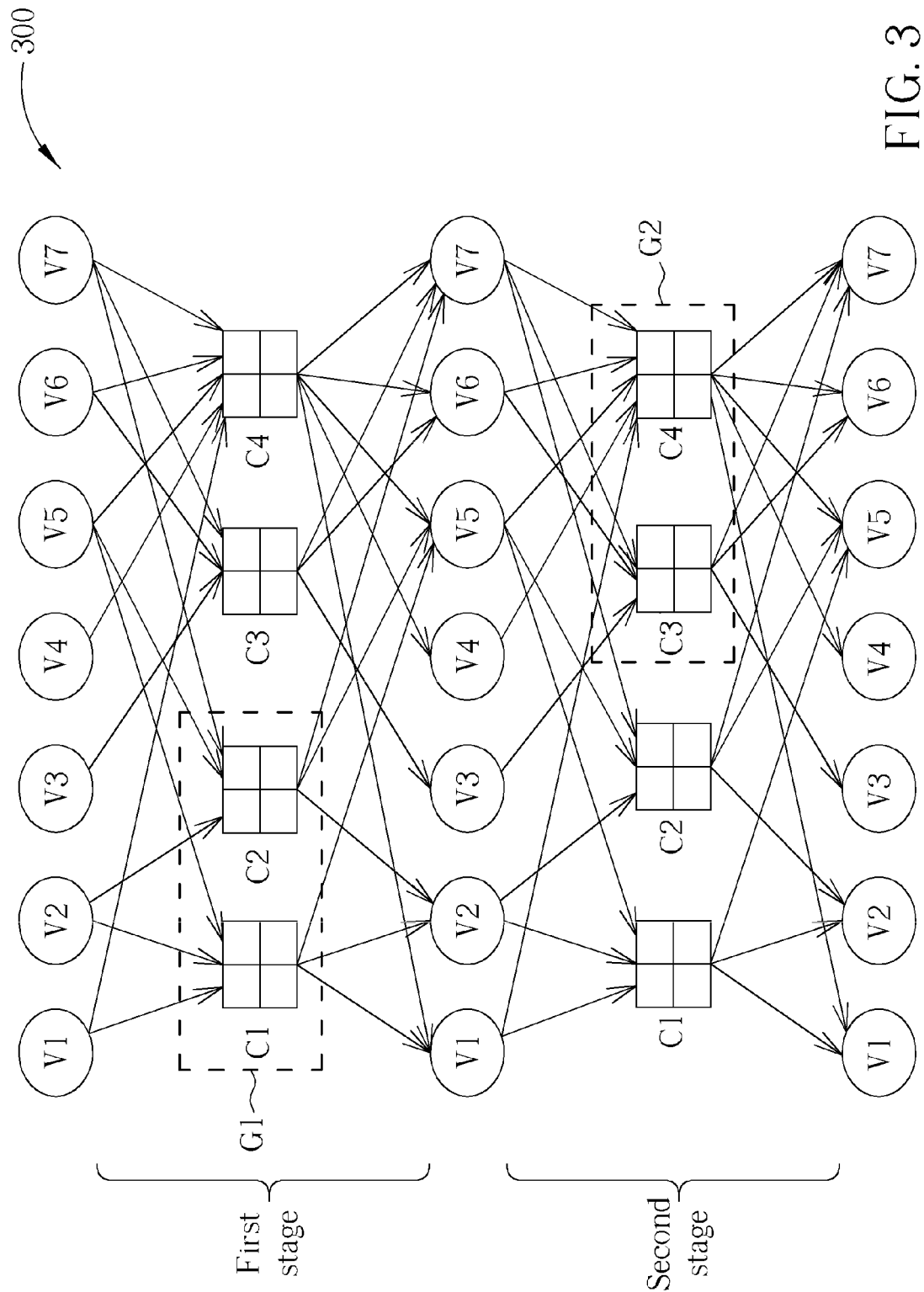
FIG. 3 is a diagram illustrating a multi-stage graph according to a predetermined parity check matrix and the plurality of underdetermined nodes.

Therefore, in step 202, a multi-stage graph 300 can be generated as shown in FIG. 3. FIG. 3 is a diagram illustrating the multi-stage graph 300 according to the predetermined parity check matrix H and the plurality of underdetermined nodes V1, V2, V3, V4, V5, V6, V7. The plurality of specific nodes C1, C2, C3, C4 comprise a plurality of paths connected to the plurality of underdetermined nodes V1, V2, V3, V4, V5, V6, V7. In addition, the message sent from an underdetermined node goes back to itself after two time stages. Moreover, the length formed a short cycle is four, thus the girth of the predetermined parity check matrix H is four. Furthermore, the plurality of specific nodes C1, C2, C3, C4 are categorized into the plurality of sub-groups G1, G2 in step 204, wherein the first sub-group G1 comprises the specific nodes C1, C2, and the second sub-group G2 comprises the specific nodes C3, C4, and each specific node has a plurality of paths connecting to a plurality of nodes of the plurality of underdetermined nodes V1, V2, V3, V4, V5, V6, V7. Then, the sub-groups G1, G2 are expanded into two stages in step 206. In this embodiment, the specific nodes C1, C2 in the first sub-group G1 performs the checking calculation upon the underdetermined nodes V1, V2, V5, V7 in the first stage, and the specific nodes C3, C4 in the second sub-group G2 performs the checking calculation upon the underdetermined nodes V1, V3, V4, V5, V6, V7 in the second stage.

In step 208, the plurality of weightings δ1, δ2, δ3, δ4 can be determined by the following equation (1):

$$\delta_i = \sum_{j=1}^{L} \frac{1}{j+1} * \gamma_{i,j}, \quad (1)$$

wherein $1 \leq i \leq M$, $M=4$, $1 \leq j \leq L$, and $Y_{i,j}$ denotes the number of cycles for a specific node Ci with the length of $2(j+1)$, and $Y_{i,j}$ is set to 0 initially. Please note that, the maximum length of a cycle is $2(L+1)$, and $L=1$ in this embodiment. Then, for each specific node Ci, calculate the $Y_{i,j}$ for all j, i.e., search all cycles with the length of $2(j+1)$. For example, if there are k cycles passed through the specific node Ci with the length of $2(j+1)$, then set the $Y_{i,j}$ as k. Then, the weighting δi of the specific node Ci can be obtained by the equation (1). More specifically, all possible cycles with length 4 in FIG. 3 are shown as below:

{V1, C1, V5, C4, V1},
{V2, C1, V5, C2, V2},
{V5, C2, V7, C4, V5},
{V6, C3, V7, C4, V6}.

Accordingly, the number of cycles that passing through the specific nodes C1, C2, C3, C4 with length 4 are 2, 2, 1, 3, respectively, which can be represented by the following vector $\Gamma_{4*1}$:

$\Gamma_{4*1} = [2, 2, 1, 3]^T$.

Then, according to the equation (1), the weightings of the specific nodes C1, C2, C3, C4 can be represented by the following vector $\Delta_{M*1}$:

$$\Delta_{M*1} = \frac{1}{(1+1)} * [2, 2, 1, 3]^T = [1, 1, 0.5, 1.5]^T.$$

It can be viewed that, the specific node C4 has the largest weighting, which is 1.5, and the specific node C3 has the least weighting.

Figure 4:
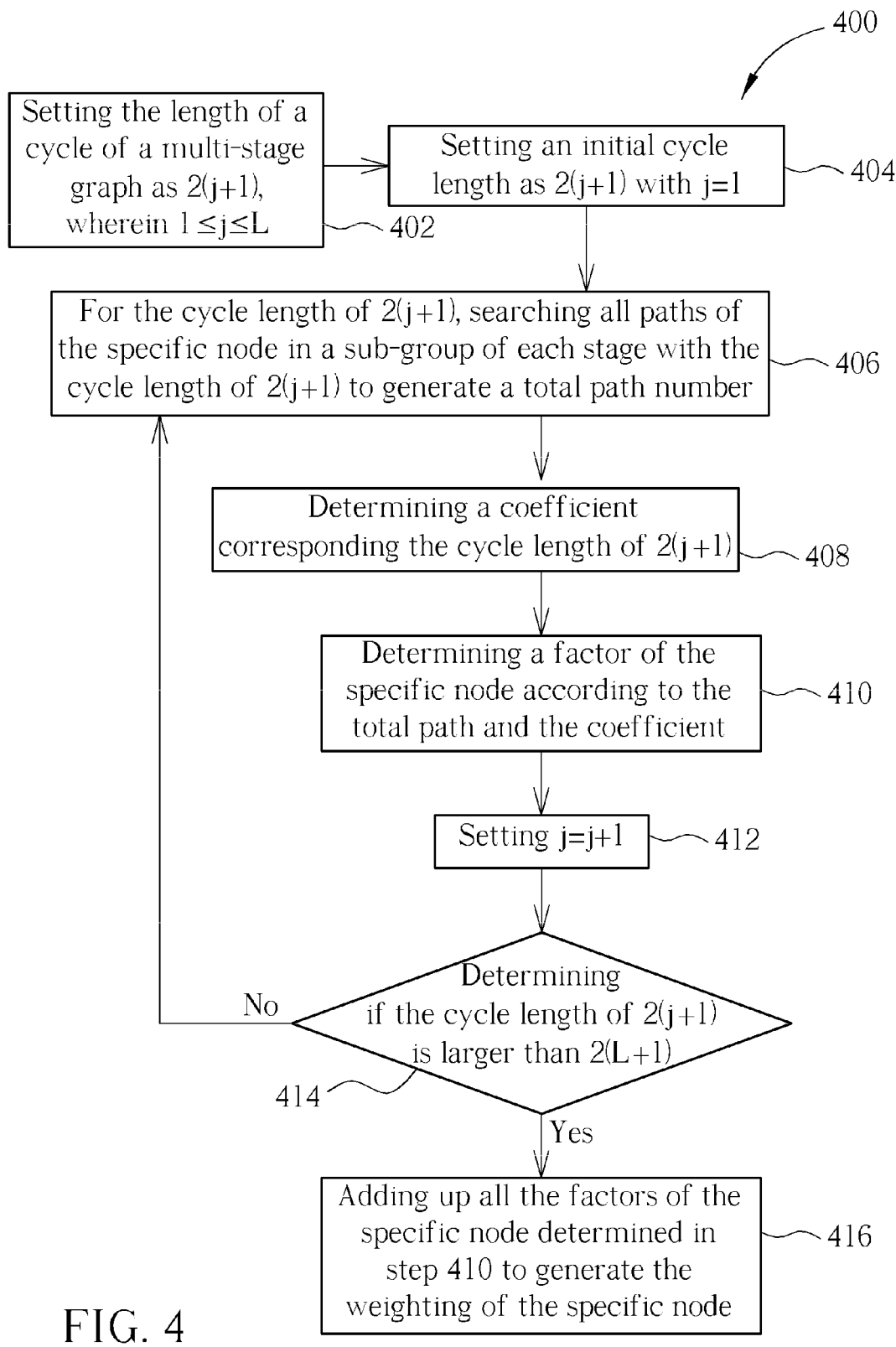
FIG. 4 is a flowchart illustrating the method of determining a weighting corresponding to a specific node according to an embodiment of the present invention.

Briefly, the determination of a weighting corresponding to a specific node (i.e., Ci) in step 208 can be summarized in FIG. 4. FIG. 4 is a flowchart illustrating the method 400 of determining the weighting corresponding to the specific node Ci according to an embodiment of the present invention. Provided that substantially the same result is achieved, the steps of the flowchart shown in FIG. 4 need not be in the exact order shown and need not be contiguous, that is, other steps can be intermediate. The method 400 comprises the following steps:

step 402: setting the length of a cycle of a multi-stage graph as $2(j+1)$, wherein $1 \leq j \leq L$, and $2(L+1)$ is the maximum cycle length of the multi-stage graph;

step 404: setting an initial cycle length as $2(j+1)$ with j=1;

step 406: for the cycle length of $2(j+1)$, searching all paths of the specific node in a sub-group of each stage with the cycle length of $2(j+1)$ to generate a total path number;

step 408: determining a coefficient corresponding the cycle length of $2(j+1)$;

step 410: determining a factor of the specific node according to the total path and the coefficient;

step 412: setting j=j+1;

step 414: determining if the cycle length of $2(j+1)$ is larger than $2(L+1)$, if no, go to step 406, if yes, go to step 416;

step 416: adding up all the factors of the specific node determined in step 410 to generate the weighting of the specific node.

In step 406, the total path number of the specific node Ci corresponding the cycle length of $2(j+1)$ is $Y_{i,j}$. In step 408, the coefficient of the specific node corresponding the cycle length of $2(j+1)$ is $1/(j+1)$. Accordingly, in step 416, the weighting of the specific node Ci is $$\delta_i = \sum_{j=1}^{L} \frac{1}{j+1} * \gamma_{i,j}.$$

Figure 5:
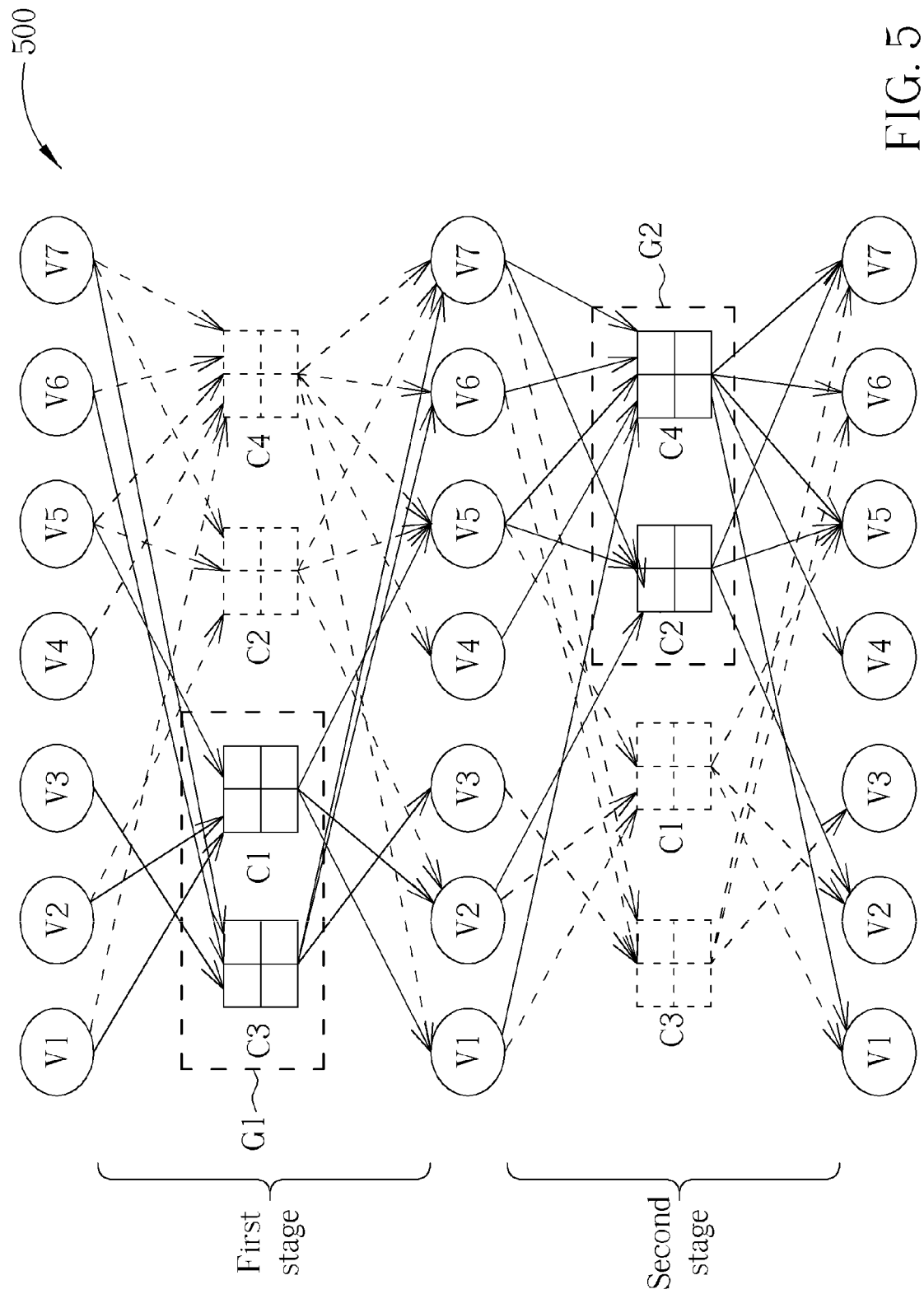
FIG. 5 is a diagram illustrating a re-scheduled multi-stage graph according to the parity check matrix and the plurality of underdetermined nodes.

When all of the weightings δ1, δ2, δ3, δ4 corresponding to the specific nodes C1, C2, C3, C4 are determined, the order of the specific nodes C1, C2, C3, C4 are reordered according to the plurality of weightings δ1, δ2, δ3, δ4 to generate the parity check matrix H' in step 416. In this embodiment, the weightings of the specific nodes C1, C2, C3, C4 are 1, 1, 0.5, 1.5 respectively. Then, the specific node with the smallest weighting is arranged at the most left side, and the specific node with the second smallest weighting is arranged at the second most left side, and so on. Accordingly, a plurality of reordered specific nodes C3, C1, C2, C4 can be generated as shown in FIG. 5. FIG. 5 is a diagram illustrating the re-scheduled multi-stage graph 500 according to the parity check matrix H' and the plurality of underdetermined nodes V1, V2, V3, V4, V5, V6, V7, in which the parity check matrix H' is represented by the following matrix:

$$H' = \begin{pmatrix} 0 & 0 & 1 & 0 & 0 & 1 & 1 \\ 1 & 1 & 0 & 0 & 1 & 0 & 0 \\ 0 & 1 & 0 & 0 & 1 & 0 & 1 \\ 1 & 0 & 0 & 1 & 1 & 1 & 1 \end{pmatrix}.$$

Please note that, the parity check matrix H' is a low density parity-check codes (LDPC codes). Furthermore, after scheduling, the specific nodes C3, C1 are categorized in the sub-groups G1, and the specific nodes C2, C4 are categorized in the sub-groups G2 as shown in FIG. 5. Then, the horizontal shuffled belief propagation (HSBP) algorithm can be applied to decode the plurality of underdetermined nodes V1, V2, V3, V4, V5, V6, V7 in conjunction with the parity check matrix H'. Please note that, in another embodiment of the present invention, the vertical shuffled belief propagation (VSBP) algorithm is applied to decode the plurality of underdetermined nodes V1, V2, V3, V4, V5, V6, V7 in conjunction with the parity check matrix H'.

In conclusion, after scheduling, the proposed method 200 reduces the dependence in the LDPC decoding. More specifically, the underdetermined nodes V1, V2, V5 acquired by the specific node C1 and the underdetermined nodes V3, V6, V7 acquired by the specific node C3 are all different. However, according to the conventional multi-stage graph 10, there has two bit nodes, i.e., v2, v5, are overlapped in the bit nodes v1, v2, v5 acquired by the check node c1 and the bit nodes v2, v5 acquired by the check node c2.

Those skilled in the art will readily observe that numerous modifications and alterations of the device and method may be made while retaining the teachings of the invention.

What is claimed is:

1. A method for generating a parity check matrix to decode a plurality of underdetermined nodes, comprising:
   determining a plurality of specific nodes according to a predetermined parity check matrix;
   determining a plurality of weightings corresponding to the plurality of specific nodes; and
   sorting the plurality of specific nodes according to the plurality of weightings to generate a parity check matrix to store in a storage device.

2. The method for generating the parity check matrix of claim 1, wherein each of the plurality of specific nodes is a check node, and each of the plurality of underdetermined nodes is a bit node.

3. The method for generating the parity check matrix of claim 1, wherein each of the plurality of specific nodes is a bit node, and each of the plurality of underdetermined nodes is a check node.

4. The method for generating the parity check matrix of claim 1, further comprising:
   categorizing the plurality of specific nodes into a plurality of sub-groups, wherein each sub-group comprises at least one specific node, and each specific node has a plurality of paths connecting to a plurality of nodes of the plurality of underdetermined nodes; and
   expanding the plurality of sub-groups into a plurality of stages correspondingly; and
   the step of determining the plurality of weightings corresponding to the plurality of specific nodes comprising:
   for each specific node in a sub-group of each stage:
     searching all paths of the specific node with a first length as long as a first cycle length of the plurality of stages to generate a first total path number of the specific node;
     determining a first coefficient corresponding the first cycle length;
     determining a first factor of the specific node according to the first total path and the first coefficient; and
     determining a weighting of the specific node according to the first factor.

5. The method for generating the parity check matrix of claim 4, wherein the step of determining the plurality of weightings corresponding to the plurality of specific nodes further comprises:
   for each specific node in the sub-group of each stage:
     searching all paths of the specific node with a second length as long as a second cycle length of the plurality of stages to generate a second total path number of the specific node;
     determining a second coefficient corresponding to the second cycle length; and
     updating the first factor of the specific node according to the second total path and the second coefficient.

6. The method for generating the parity check matrix of claim 5, wherein the step of updating the factor of the specific node comprises:
   generating a second factor according to the second total path and the second coefficient; and
   adding up the second factor to the first factor to update the first factor.

7. The method for generating the parity check matrix of claim 5, wherein the first cycle length and the second cycle length are defined by 2(j+1), and the first coefficient and the second coefficient are defined by 1/(j+1), j is an integer number.

8. The method for generating the parity check matrix of claim 1, wherein the step of sorting the plurality of specific nodes comprises:
   reordering the plurality of specific nodes from a specific node with the smallest weighting to the specific node with the largest weighting sequentially to generate a plurality of reordered specific nodes; and
   generating the parity check matrix according to the plurality of reordered specific nodes.

9. The method for generating the parity check matrix of claim 1, wherein the parity check matrix is a low density parity check matrix.

10. The method for generating the parity check matrix of claim 1, wherein the parity check matrix is applicable in a horizontal shuffled belief propagation algorithm for decoding the plurality of underdetermined nodes.

11. The method for generating the parity check matrix of claim 1, wherein the parity check matrix is applicable in a vertical shuffled belief propagation algorithm for decoding the plurality of underdetermined nodes.

* * * * *